(12) United States Patent
Thomas et al.

(10) Patent No.: US 7,165,863 B1
(45) Date of Patent: Jan. 23, 2007

(54) ILLUMINATION SYSTEM

(75) Inventors: James G. Thomas, Largo, FL (US); Bryan T. Warner, St. Petersburg, FL (US); Michael J. McCarthy, Clearwater, FL (US)

(73) Assignee: Pricilla G. Thomas, Tierra Verde, FL (US)

( * ) Notice: Subject to any disclaimer, the term of this patent is extended or adjusted under 35 U.S.C. 154(b) by 13 days.

(21) Appl. No.: 10/948,824

(22) Filed: Sep. 23, 2004

(51) Int. Cl.
*F21S 4/00* (2006.01)

(52) U.S. Cl. .................. 362/219; 362/222; 362/237; 362/294; 362/373; 362/800; 439/391; 439/426

(58) Field of Classification Search ............. 362/800, 362/219, 217, 294, 391, 237, 222, 221, 373; 439/391, 426, 427; 361/688, 749
See application file for complete search history.

(56) References Cited

U.S. PATENT DOCUMENTS

| | | |
|---|---|---|
| 3,936,686 A | 2/1976 | Moore |
| 4,143,411 A | 3/1979 | Roberts |
| 4,149,217 A | 4/1979 | Tucker |
| 4,416,411 A | 11/1983 | Desmond et al. |
| 4,612,206 A | 9/1986 | Shimozato et al. |
| 4,612,606 A | 9/1986 | Roberts |
| 4,720,773 A | 1/1988 | Ahroni |
| 4,855,882 A | 8/1989 | Boss |
| 4,908,743 A | 3/1990 | Miller |
| 5,015,918 A | 5/1991 | Copeland |
| 5,103,382 A | 4/1992 | Kondo et al. |
| 5,222,799 A | 6/1993 | Sears et al. |
| 5,499,170 A | 3/1996 | Gagne |
| 5,526,236 A | 6/1996 | Burnes et al. |
| 5,607,227 A | 3/1997 | Yasumoto et al. |
| 5,697,175 A | 12/1997 | Schwartz |
| 5,746,497 A | 5/1998 | Machida |
| 5,857,767 A | 1/1999 | Hochstein |
| 5,892,192 A | 4/1999 | Ishiguro et al. |
| 5,924,785 A | 7/1999 | Zhang et al. |
| 5,931,577 A | 8/1999 | Ishibashi |
| 6,045,240 A | 4/2000 | Hochstein |
| 6,072,280 A | 6/2000 | Allen |
| 6,116,748 A | 9/2000 | George |
| 6,167,648 B1 | 1/2001 | Dimmick |
| 6,183,104 B1 | 2/2001 | Ferrara |
| 6,244,728 B1 | 6/2001 | Cote et al. |
| 6,283,612 B1 | 9/2001 | Hunter |
| 6,346,777 B1 | 2/2002 | Kim |
| 6,350,039 B1 | 2/2002 | Lee |
| 6,371,637 B1 | 4/2002 | Atchinson et al. |

(Continued)

*Primary Examiner*—Alan Cariaso
*Assistant Examiner*—Leah S. Lovell
(74) *Attorney, Agent, or Firm*—McDermott, Will & Emery, LLP

(57) ABSTRACT

A module has a metallic mass with an upper surface having laterally spaced wiring channels and outwardly extending fins. A circuit board is mounted on the module and fabricated of an insulating bottom layer with trace patterns thereon. A plurality of electrical components, including at least one light emitting diode, are coupled to the trace patterns of the circuit board. A pair of continuous conductor wires couple the electrical components with each wire and extend through the wiring channels of the module. At least one pair of connectors extend through the circuit board with upper ends coupled with the trace patterns and lower ends extending downwardly to electrically couple with the wires.

33 Claims, 6 Drawing Sheets

U.S. PATENT DOCUMENTS

| | | |
|---|---|---|
| 6,394,626 B1 | 5/2002 | McColloch |
| 6,396,466 B1 | 5/2002 | Pross et al. |
| 6,416,200 B1 | 7/2002 | George |
| 6,431,728 B1 | 8/2002 | Fredericks et al. |
| 6,578,986 B2 | 6/2003 | Swaris et al. |
| 6,617,520 B1 | 9/2003 | Martter et al. |
| 6,665,170 B1 | 12/2003 | Warner et al. |
| 6,712,486 B1 | 3/2004 | Popovich et al. |
| 6,846,093 B2 | 1/2005 | Swaris et al. |
| 6,932,495 B2 * | 8/2005 | Sloan et al. ................ 362/294 |
| 2001/0015891 A1 | 8/2001 | Suzuki et al. |
| 2003/0218878 A1 | 11/2003 | Swaris et al. |

* cited by examiner

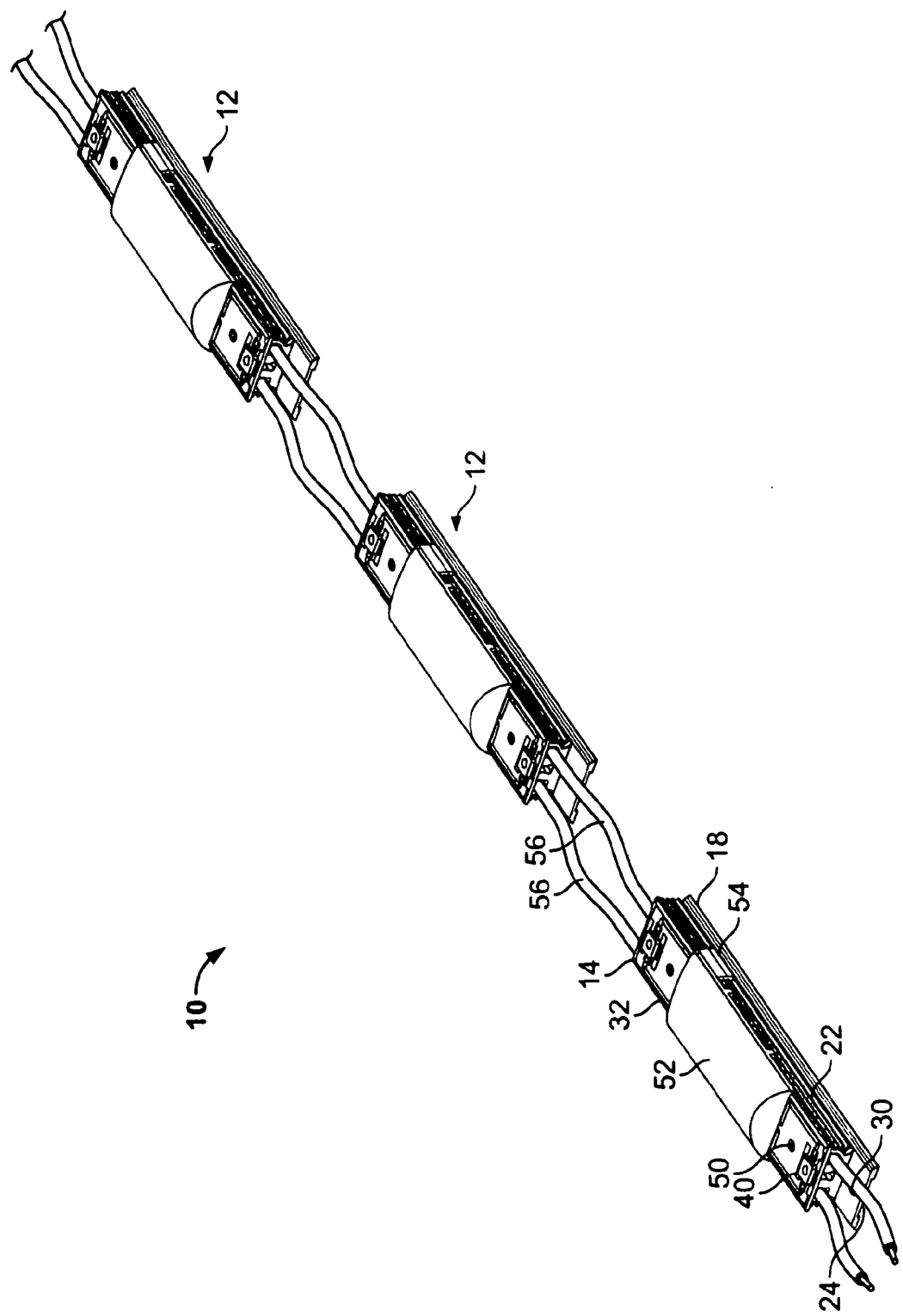

ILLUMINATION SYSTEM

BACKGROUND OF THE INVENTION

1. Field of the Invention

The present invention relates to an illumination system and more particularly to providing high-power, high-intensity light emitting diode modules that are economic to produce and operate.

2. Description of the Prior Art

Recent improvements in the growth and manufacture of the crystals utilized in the production of the light emitting diodes has permitted greater utility and flexibility for its use as an alternative to standard sign industry lighting sources such as neon, fluorescent, cold cathode, metal halide, incandescent and high pressure sodium light sources. Light emitting diodes offer a low voltage alternative to the standard or high voltage lighting sources mentioned. Further developments in light emitting diodes technology have permitted a greater ability to modulate the intensity and light output expanding the potential applications for light emitting diodes lighting technology. Various industries, including the sign industry, have maximized this benefit to produce new and useful and unobvious illumination patterns and techniques.

Various corporations have introduced the improved light emitting diodes utilizing different and varying approaches to achieving similar lighting applications in the signage industry. Light emitting diode lighting systems are strung together in different and varying configurations. Further advancements have been made and light emitting diodes technology has been accepted in mainstream use as a superior lighting alternative as evidenced by street signal lighting and changing traffic signals beginning to convert to arrayed light emitting diodes as the preferred lighting for its intensity, visibility and clarity.

The use of illumination systems of known designs and configurations is known in the prior art. More specifically, illumination systems of known designs and configurations previously devised and utilized for the purpose of illumination with light emitting diodes are known to consist basically of familiar, expected, and obvious structural configurations, notwithstanding the myriad of designs encompassed by the crowded prior art which has been developed for the fulfillment of countless objectives and requirements.

By way of example, U.S. Pat. No. 6,394,626 to McColloch discloses a flexible light track for signage. U.S. Pat. No. 6,371,637 to Atchinson et al. discloses a compact, flexible LED array. U.S. Pat. No. 6,283,612 to Hunter discloses a light emitting diode light strip. U.S. Pat. No. 6,167,648 to Dimmick discloses an illuminated modular sign having adjustable quick release modules. U.S. Pat. No. 5,931,577 to Ishibashi discloses a display device and method for making the same. U.S. Pat. No. 5,924,785 to Zhang et al. discloses a light source arrangement. U.S. Pat. No. 6,346,777 to Kim discloses an LED lamp apparatus. Lastly, U.S. Pat. No. 6,072,280 to Allen discloses an LED light string employing series-parallel block coupling.

While these devices fulfill their respective, particular objectives and requirements, the aforementioned patents do not describe an illumination system that allows providing high-power, high-intensity light emitting diode modules that are economic to produce and operate.

In this respect, the illumination system according to the present invention substantially departs from the conventional concepts and designs of the prior art, and in doing so provides an apparatus primarily developed for the purpose of providing high-power, high-intensity light emitting diode modules that are economic to produce and operate.

The present invention relates to a linear, linked and stranded high-power, high-intensity light emitting diode illumination system utilizing modules with a metal-core, ceramic coated printed circuit board with surface mounted electrical components required to produce light through the plurality of light emitting diodes. The present invention also relates to improvements in light emitting diodes and advancements in design specification, printed circuit board layouts and electrical component configurations. The present invention, through its specific design, most efficiently utilizes the minimum amount of low voltage electricity to maximize lighting intensity across the standard lighting spectrum, i.e., red range, amber, orange, blue, white, and green. The present invention, referencing specific electrical component configurations and anticipated flow of electrical current, when segmented units are utilized singularly or in plurality, minimizes "voltage resistance drop" across a segmented unit or a group in parallel, calculated in Ohms.

Therefore, it can be appreciated that there exists a continuing need for a new and improved illumination system which can be used for providing high-power, high-intensity light emitting diodes that are economic to produce and operate. In this regard, the present invention substantially fulfills this need.

SUMMARY OF THE INVENTION

In view of the inherent limitations regarding conventional lighting systems as well as solid state lighting systems, the present invention moves the development of high-power, high intensity light emitting diodes into a system that is both economic to produce as well as economic to operate.

In view of the foregoing disadvantages inherent in the known types of illumination systems of known designs and configurations now present in the prior art, the present invention provides an improved light emitting diode illumination system. As such, the general purpose of the present invention, which will be described subsequently in greater detail, is to provide a new and improved light emitting diode illumination system and method which has all the advantages of the prior art and none of the disadvantages.

To attain this, the present invention essentially comprises at least one module with a metal-core, ceramic coated printed circuit board assembly, and a specifically designed heat-sink. The metal-core, ceramic coated printed circuit board is rectangular in configuration. The metal-core, ceramic coated printed circuit board has front and back faces. The metal-core, ceramic coated printed circuit board segments have electrical elements coupled to the front face. The electrical elements include two or more light emitting diodes, and a plurality of resistors. The metal-core, ceramic coated printed circuit board has a single associated high-frequency "noise" filtering capacitor and a plurality of associated rectifying diodes. The rectifying diodes convert AC to DC. One pair of inverted electrical insulation displacement connectors are affixed for the first time on the back side of the metal-core, ceramic coated printed circuit board with through-hole technology, that couple the light emitting diode module to a pair of continuous individual stranded and insulated copper core conductor wires. These connectors are capable of coupling the electrical elements to a source of electrical potential. In this manner the light emitting diodes are illuminated with minimum current while generating minimum heat.

More particularly, the present invention essentially comprises a plurality of similarly configured modules. Each module has a metallic mass with an elongated upper component and an elongated lower component. Each upper component includes a generally flat lower surface and upper surface with laterally spaced wiring channels and a central longitudinal void there between. Each upper component also includes curved sides with outwardly extending fins for heat sink purposes. Each lower component has a lower surface with a longitudinal depressed area with a foam tape there within and an upper surface coupled to the lower surface of the upper component. Each lower component has a length greater than the length of its associated upper component to form a mounting tab with a mounting aperture there through.

Each module also has a circuit board with a front face and a back face mounted on the upper surface of the upper component. Each circuit board is fabricated of an insulating bottom layer with trace patterns thereon and forming the back face. The bottom layer is fabricated of multi-layers of dissimilar material construction with a bottom layer consisting of high grade steel, a second layer consisting of a dielectric coating, a third layer consisting of the copper trace layer, a fourth layer consisting of an additional sandwiching dielectric layer, and a final ceramic coated top layer.

Next provided is a plurality of electrical components coupled to the trace patterns of each circuit board. Such electrical components include two high-power high-intensity light emitting diodes, a light emitting diode driver control chip, a single high-frequency cap filter to abate "noise", rectifying diodes that convert electrical potential from AC to DC, surface mounted resistors of specific values to regulate the electrical potential and illuminate the light emitting diodes. Each circuit board has two pairs of small holes for the passage of the insulation displacement connectors and one pair of large holes for machine screws to couple the circuit boards to the metallic mass extending there through.

Each module also has a translucent cap cover positionable over the central extent of an associated circuit board with a generally semi-cylindrical upper surface and lateral snap tabs adapted to couple with its associated circuit board.

Next provided is a pair of alternating current carrying continuous insulated stranded copper core conductor wires coupling the plurality of modules in parallel. Each wire extends through aligned wiring channels of the upper components of the modules. These wires are continuous and unsegmented. A cross cut channel is formed in the upper component of the mass for allowing the electrical components to couple with the wires.

Lastly, pairs of electrically conductive insulation displacement connectors extend through each of the circuit boards in proximity to their ends with upper ends coupled with the trace patterns and lower ends extending into the cross-cut channels to frictionally affix, and electrically couple, the connectors and the wires.

There has thus been outlined, rather broadly, the more important features of the invention in order that the detailed description thereof that follows may be better understood and in order that the present contribution to the art may be better appreciated. There are, of course, additional features of the invention that will be described hereinafter and which will form the subject matter of the claims attached.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of descriptions and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore an object of the present invention to provide a new and improved light emitting diode illumination system which has all of the advantages of the prior art illumination systems of known designs and configurations and none of the disadvantages.

It is another object of the present invention to provide a new and improved light emitting diode illumination system which may be easily and efficiently manufactured and marketed.

It is further an object of the present invention to provide a new and improved light emitting diode illumination system which is of durable and reliable construction.

An even further object of the present invention is to provide a new and improved light emitting diode illumination system which is capable of low cost manufacture with regard to both materials and labor, and which accordingly is then available for low prices of sale to the consuming public, thereby making such light emitting diode illumination system economically available to the buying public.

Even still another object of the present invention is to provide a light emitting diode illumination system for the economic and convenient fabrication of a linear, stranded and linked, high-power, high-intensity light emitting diode illumination system.

A further object of the present invention to provide a new and improved linear, stranded and linked high-power, high-intensity light emitting diode illumination system comprising of a metal-core, ceramic coated printed circuit board, and a specifically designed heat-sink. The metal-core, ceramic coated printed circuit board is in a rectangular configuration. The metal-core, ceramic coated printed circuit board has front and back faces. The metal-core, ceramic coated printed circuit board has electrical elements coupled to the front face. The electrical elements include two or more light emitting diodes, and a plurality of resistors. The metal-core, ceramic coated printed circuit board has a single associated high-frequency "noise" filtering capacitor and a plurality of associated rectifying diodes. The rectifying diodes convert AC to DC. One pair of inverted electrical insulation displacement connectors are affixed for the first time on the back side of the metal-clad printed circuit board with through-hole technology, that couple the light, emitting diode module to a pair of continuous individual stranded and insulated copper core conductor wires. These connectors are capable of coupling the electrical elements to a source of electrical potential. In this manner the light emitting diodes are illuminated with minimum current while generating minimum heat.

Lastly, it is an object of the present invention to provide a new and improved illumination system having a module with a metallic mass with an upper surface having laterally spaced wiring channels and outwardly extending fins, a circuit board mounted on the module and fabricated of an insulating bottom layer with trace patterns thereon, a plurality of electrical components, including at least one light emitting diode, coupled to the trace patterns of the circuit board, a pair of conductor wires coupling the electrical components with each wire and extending through the wiring channels of the module, and at least one pair of connectors extending through the circuit board with upper ends coupled with the trace patterns and lower ends extending downwardly to electrically couple with the continuous wires.

These objects together with other various objects of the present invention, along with the various features of novelty which characterize the invention, are pointed out with particularity in the various claims annexed to and forming a part of this disclosure. For a better understanding of the present invention, its operating advantages and the specific objects attained by its uses, reference should be had to the accompanying drawings as well as the descriptive matter in which there is illustrated and described the preferred embodiment of the present invention.

BRIEF DESCRIPTION OF THE DRAWINGS

The invention will be better understood and objects other than those set forth above will become apparent when consideration is given to the following detailed description thereof. Such description makes reference to the annexed drawings wherein:

FIG. 1 is a perspective illustration of the illumination system, including coupling between system modules constructed in accordance with the principles of the present invention.

DESCRIPTION OF THE PREFERRED EMBODIMENT

Figure 2A:
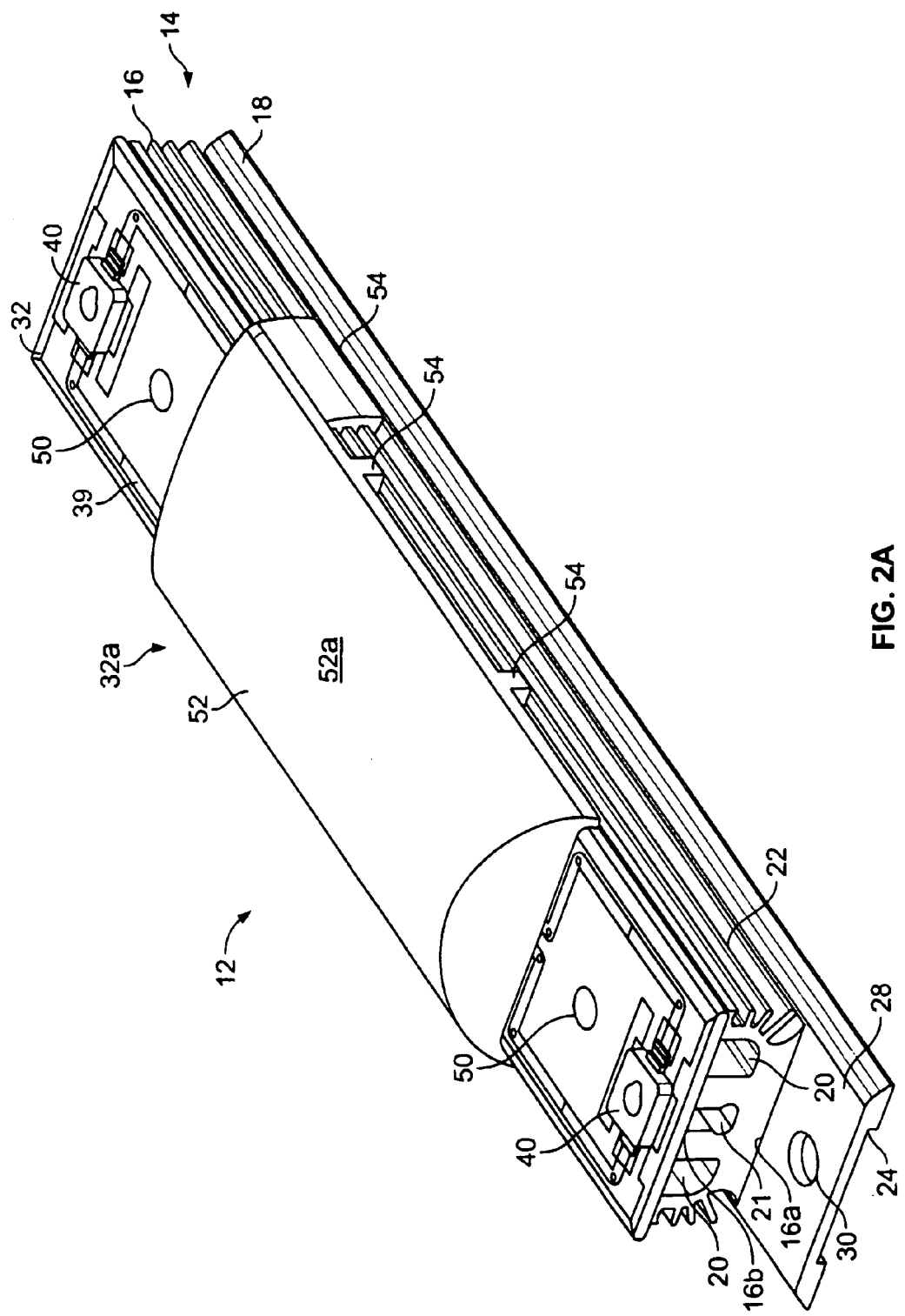
FIG. 2A is an enlarged perspective illustration of a module as depicted in FIG. 1.

With reference now to the drawings, and in particular to FIG. 1 thereof, the preferred embodiment of the new and improved illumination system embodying the principles and concepts of the present invention and generally designated by the reference numeral 10 will be described.

The present invention, the illumination system 10 is comprised of a plurality of components. Such components in their broadest context include a module 12 having a printed circuit board assembly 32, a plurality of electrical components 37, a pair of conductor wires 56 and at least one pair of connectors 60. Such components are individually configured and correlated with respect to each other so as to attain the desired objective.

A plurality of similarly configured modules 12 is first provided. Each module 12 has a metallic heat sink mass 14 with an elongated upper component 16 and an elongated lower component 18. Each upper component 16 includes a generally flat lower surface 16a and upper surface 16b with laterally spaced wiring channels 20 and a central longitudinal void 21 there between. Each upper component 16 also includes curved sides 16c with outwardly extending fins 22 for heat sink purposes. Each lower component 18 has a lower surface 18a with a longitudinal depressed area 24 with a foam tape 26 there within, and an upper surface 18b coupled to the lower surface 16a of the upper component 16. Each lower component 18 has a length greater than the length of its associated upper component to form a mounting tab 28 with a mounting aperture 30 there through.

Each module 12 also has a circuit board assembly 32 with a front face 34 and a back face 36 mounted on the upper surface 16b of the upper component 16. Each circuit board assembly 32 comprises a bottom layer 38a fabricated from multi-layers of dissimilar material construction such as high grade steel, a second layer 38b consisting of a dielectric coating, a third layer 38c having a copper trace pattern 39, a fourth layer 38d consisting of an additional sandwiching dielectric coating, and a top or fifth layer 38e of ceramic coating.

Next provided is a plurality of electrical components 37 coupled to the trace patterns 39 of each circuit board 32. Such electrical components 37 include two high-power, high-intensity light emitting diodes 40, a light emitting diode driver control chip 41, a single high-frequency cap filter 42 to abate "noise", rectifying diodes 44 that convert electrical potential from AC to DC, surface mounted resistors 46 of specific values to regulate the electrical potential and illuminate the light emitting diodes 40. Each circuit board 32 has two pairs of small holes 48 for the passage of insulation displacement connectors 60 and one pair of large holes 50 for machine screws to couple the circuit boards to the metallic mass.

Each module 12 also has a translucent cap cover 52 positionable over the central extent 32a of an associated circuit board 32 with a generally semi-cylindrical upper surface 52a and lateral snap tabs 54 adapted to couple with its associated circuit board.

Next provided is a pair of alternating current carrying continuous insulated stranded copper core conductor wires 56 coupling the plurality of modules 12 in parallel. Each wire 56 is coupled during operation to a potential source of alternating current and extends through aligned wiring channels 20 of the upper component 16 of the modules 12. A cross cut channel 58 is formed in the upper component 16 for allowing the electrical components to couple with the wires 56.

Lastly, pairs of electrically conductive insulation displacement connectors 60 extend through each of the circuit boards 32 in proximity to their ends with upper ends 62 coupled with the trace patterns and lower ends 64 extending into the cross cut channel 58 to frictionally affix, and electrically couple, the connectors 60 and the wires 56.

With greater specificity and as shown in the illustrations, FIG. 1 is a perspective illustration of the coupling between system segments or modules 12 depicting a sectional view of a continuous, light emitting diode illumination system 10 constructed in accordance with the principles of the present invention. In this preferred embodiment of the lighting system 10, the individual lighting modules 12 are linked together in a linear fashion in parallel, by and affixed to, a pair of continuous insulated and stranded copper core conductor wires 56. These modules 12, when coupled to a power supply (not shown), can operate and function as a lighting unit singularly or in plurality, only limited by the amount of electrical potential available from the power supply and the laws of physics pertaining to electricity.

Figure 2B:
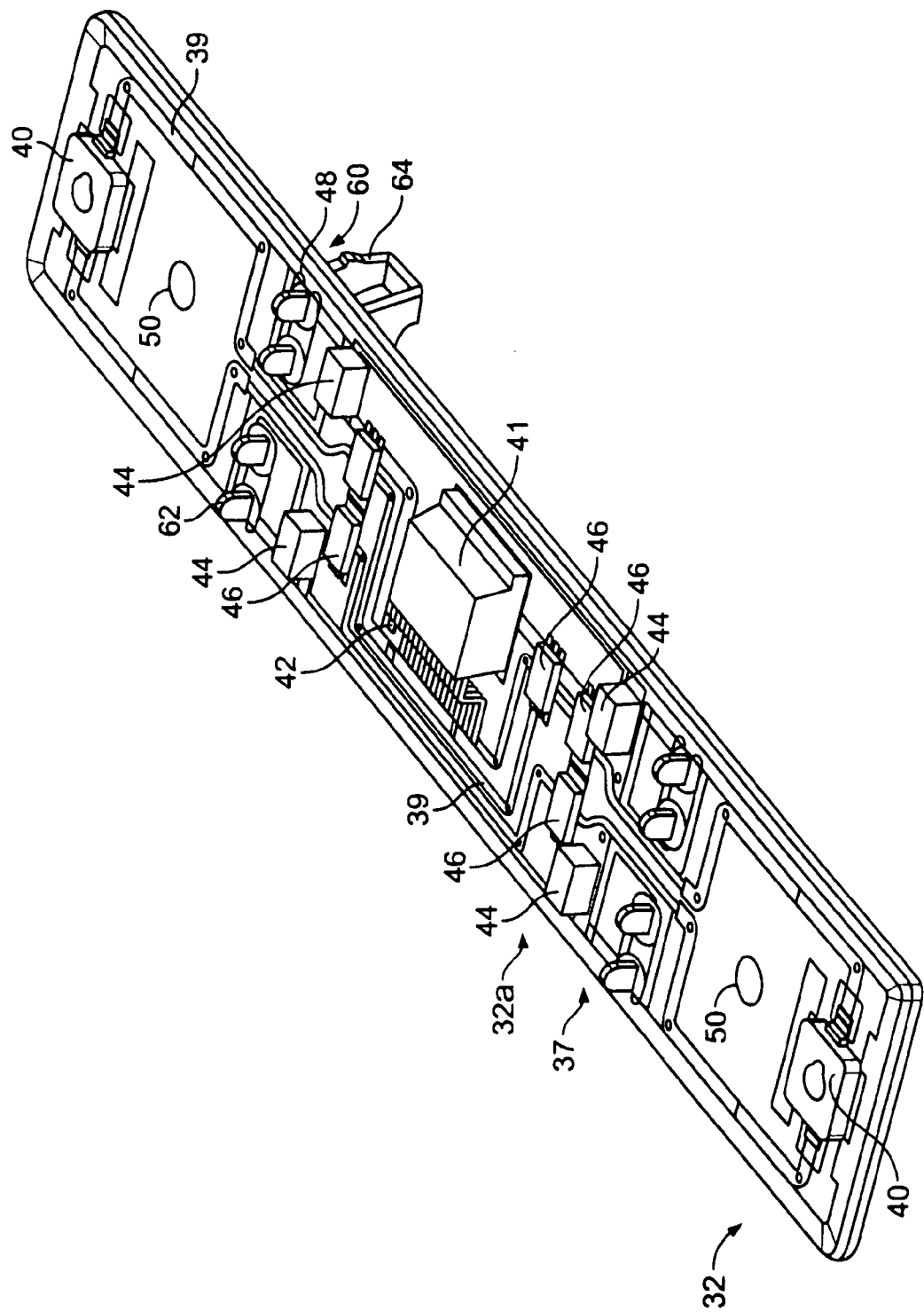
FIG. 2B is an enlarged perspective illustration of a printed circuit board of the module, without the presence of a protective plastic cover for illustrative purposes.

FIG. 2A is an enlarged perspective illustration of a segment 12 with the protective plastic cover 52 in place over the exposed electrical components 37 of the lighting device module 12, otherwise referred to as a pod, which individually or in plurality, as depicted in FIG. 1, constitutes a light source. FIG. 2B is and enlarged perspective illustration of the metal-core, ceramic coated printed circuit board 32 with all of the surface mounted electrical components 37 and light emitting diodes 40 affixed in the proper operational positions without the presence of the protective plastic cover 52 for illustrative purposes.

In these Figures, the printed circuit board 32 has a rectangular configuration. The printed circuit board 32 has front 34 and back 36 faces. The metal-core, ceramic coated printed circuit board 32 has electrical elements 37 coupled to the front face 34. The material for the bottom or metal-core layer 38a is preferably a heat conductive metal selected from the class of conductive metals including steel, stainless steel, aluminum and the like. The electrical elements 37 further include two light emitting diodes 40, a plurality of resistors 46 and a high-frequency "noise" filtering capacitor 42. There is a plurality of associated rectifying diodes 44. The rectifying diodes 44 convert alternating current (AC) to direct current (DC). One pair of inverted electrical insulation displacement connectors is provided. There is a light emitting diode control driver chip 41 which functionally provides clean and regulated electrical potential to energize and illuminate the light emitting diodes 40. An injection molded plastic cap/cover 52 is provided to cover the electrical elements from environmental detriments and intrusions. Quick-snap tabs 54 are molded into the cap 52 to frictionally attach the plastic cap/cover over the metal-core, ceramic coated printed circuit board 32 and onto the heat sink fins 22.

Figure 3A:
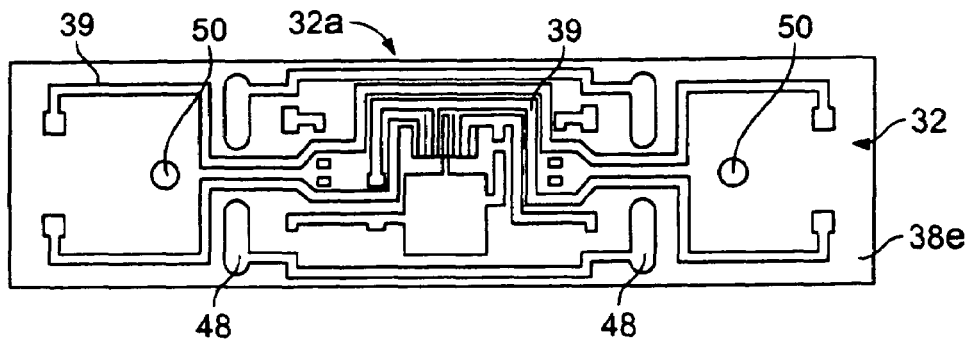
FIG. 3A is a top plan view of the printed circuit board showing a copper trace pattern.
Figure 3B:
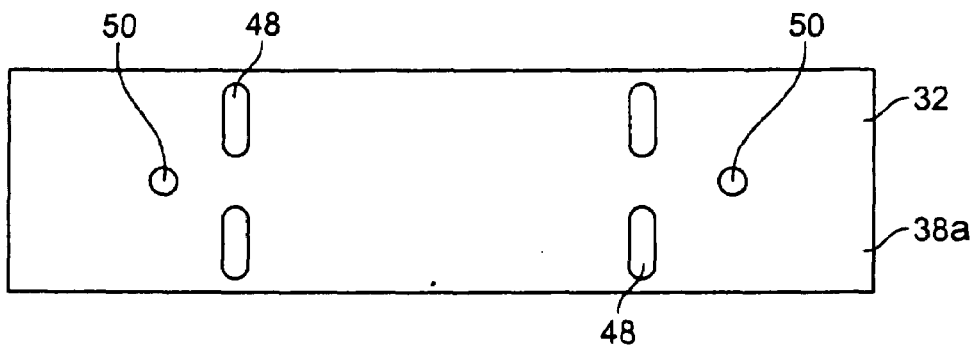
FIG. 3B is a bottom plan view of the printed circuit board.
Figure 3C:
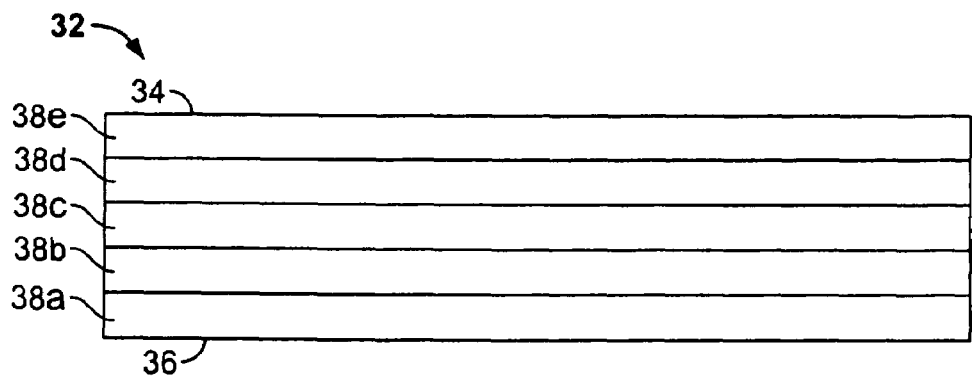
FIG. 3C is an elevation side view of the horizontal plane of the printed circuit board showing the various layers of the board.
Figure 3D:
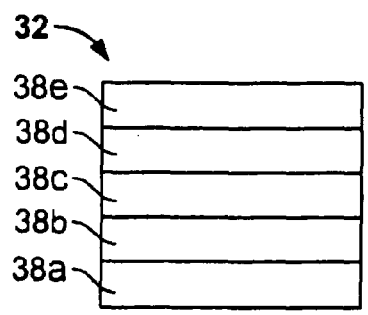
FIG. 3D is an elevation end view of the printed circuit depicting the layers of the board.

FIG. 3A is a top plan view of the metal-core, ceramic coated printed circuit board 32 showing the copper trace pattern 39 and the top view of the through-hole 50 positions for the machine screw to mechanically fasten the metal-core, ceramic coated printed circuit board 32 to the metal heat sink mass 14 shown in FIG. 4. Additionally, FIG. 3A shows the positions of the through-hole 48 positions for the insertion of the insulation displacement connectors 60 so they may be affixed untraditionally and uniquely to the bottom layer 38a of a single-sided metal-clad printed board 32. FIG. 3B is a bottom plan view of the metal-core, ceramic coated printed circuit board 32. The through-hole 50 positions for the machine screw to mechanically fasten the metal-core, ceramic coated printed circuit board 32 to the metal heat sink mass 14 and the through-hole 48 positions for the insulation displacement connectors 60. FIG. 3C is a elevation side view of the horizontal plane of the metal-core, ceramic coated printed circuit board 32 depicting the layers 38a–e incorporated in the manufacture of the metal-core, ceramic coated printed circuit board 32 which, as explained above, is comprised of a steel base substrate bottom layer 38a, a dielectric coating second layer 38b, a copper trace third layer 38c, a dielectric coating layer 38d, and a top dielectric ceramic coating or finishing layer 38e. FIG. 3D is an elevation or sectional end view of the horizontal plane of the printed circuit board 32 depicting the five layers 38a–e.

FIG. 3A illustrates the front face 34 of the printed circuit board 32 showing the copper trace pattern 39 necessary for the electrical elements 37, once attached, to function in the intended manner, while FIG. 3B shows the back face 36 of the metal-core, ceramic coated printed circuit board 32. Illustrated are the pre-stamped holes 50 for attachment of the machine screws, and the inverted insulation displacement connector holes 48. Shown in FIG. 3C is a profile view of the metal-core, ceramic coated printed circuit board 32 which shows the layers 38a–e that make up the substrate, that includes two dielectric coating layers 38d, b that sandwich a copper trace layer 38c. The bottom layer 38a consists of a high-grade steel for rigidity, even thermal distribution and transfer. Additionally, FIG. 3D is a sectional view with the same material and component description as FIG. 3C.

Figure 4A:
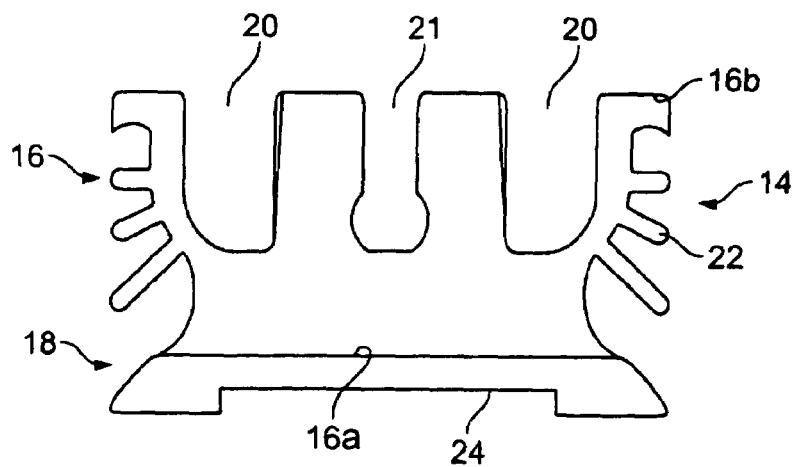
FIG. 4A is a sectional view of a heat sink mass of the module.

FIG. 4A is a sectional view of the typical cross-section of the metal heat sink mass 14 specifically designed to dissipate heat, mechanically fasten to the metal-core, ceramic coated printed circuit board 32, and allow for the positioning of the continuous insulated and stranded copper core conductor wires 56 in the appropriate wire channels 20, including the fins 22 for heat dissipation, a cut out depression 24 in the base 18 of the device 14 for double-sided tape 26 for fastening, as well as a tabbed extension 28 with a pre-drilled hole 30 for optional mechanical fastening to a substrate.

Figure 4B:
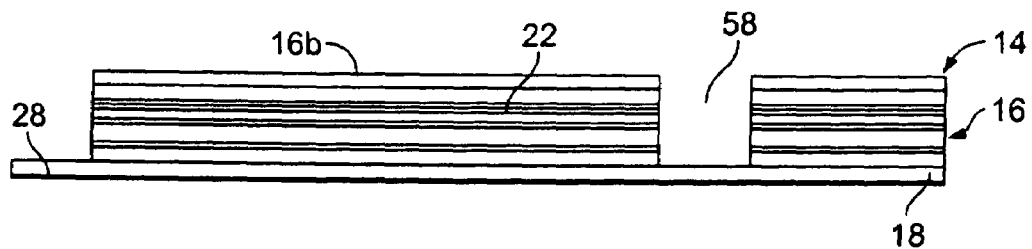
FIG. 4B is an elevation side view of the heat sink mass.

FIG. 4B is an elevation side view of the metal heat sink mass 14 specifically designed to dissipate heat, mechanically fasten to the metal-core, ceramic coated printed circuit board 32, and allow for the positioning of the continuous insulated and stranded copper core conductor wires 56 in the appropriate wire channels 20, including the fins 22 for heat dissipation, a cut out depression 24 in the base 18 of the device 14 for double-sided tape 26 for fastening as well as a tabbed extension 28 with a pre-drilled hole 30 for optional mechanical fastening to a substrate. There is depicted a cross cut 58 to allow for a void area 58a in order for the inverted insulation displacement connectors 60 to be placed on the bottom side or face 36 of the metal-core, ceramic coated printed circuit board 32 after it is mechanically fastened to the heat sink mass 14.

Figure 4C:
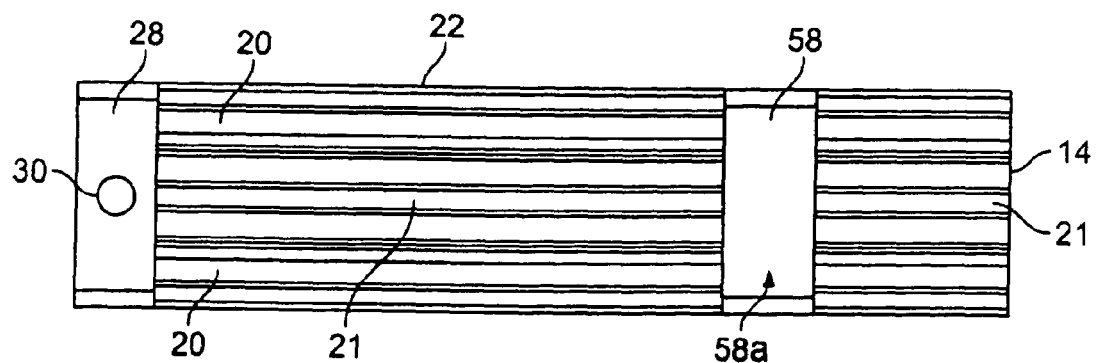
FIG. 4C is a top plan view of the heat sink mass.

FIG. 4C is a top plan view of the metal heat sink mass 14 specifically designed to dissipate heat, mechanically fasten to the metal-core, ceramic coated printed circuit board 32, and allow for the positioning of the insulated and stranded copper core conductor wires 56 in the appropriate wire channels 20, including the fins 22 for heat dissipation, a cut out depression 24 in the base 18 of the device 14 for double-sided tape 26 for fastening as well as a tabbed extension 28 with a pre-drilled hole 30 for optional mechanical fastening to a substrate. There is a depicted cross cut 58 to allow for a void area 58a in order for the inverted insulation displacement connectors 60 to be placed on the bottom side or face 36 of the metal-core, ceramic coated printed circuit board 32 after it is mechanically fastened to the heat sink mass 14.

A profile view of the specially designed metallic mass 14 is shown in FIG. 4A. It is used as a heat sink to dissipate heat energy created from the operation of a module 12 of the illumination system 10 into an attached substrate or ambient air by way of the air cooled fin 22 design present on both sides of the length of the heat sink mass 14. Specific architecture is employed in the design of this device. There is a depressed area 24 designed to accept a length of double-sided adhesive foam tape 26 in order to act as an alternative method of attachment singularly or in conjunction with the metal mounting tab 28. Wiring channels 20 are provided to allow the continuous insulated conductor wires 56 to pass through the upper body component 16 of the heat sink mass 14 and fasten to the insulation displacement connectors 60 in a cross cut channel 58 in FIG. 4B and FIG. 4C. Mechanical fastening of the machine screw (not shown) through the hole 50 on the metal-core, ceramic coated printed circuit board 32 and into the specific void in the heat sink mass 14 allow for this during assembly.

FIGS. 4B and 4C show a cross-cut tab where the extruded body of the heat sink mass 14 has specifically been removed to create a mounting tab 28, which has a pre-drilled hole 30 intended for mechanical fastening to a substrate or object by way a standard sized bolts and nuts, rivets, or screws.

Figure 5:
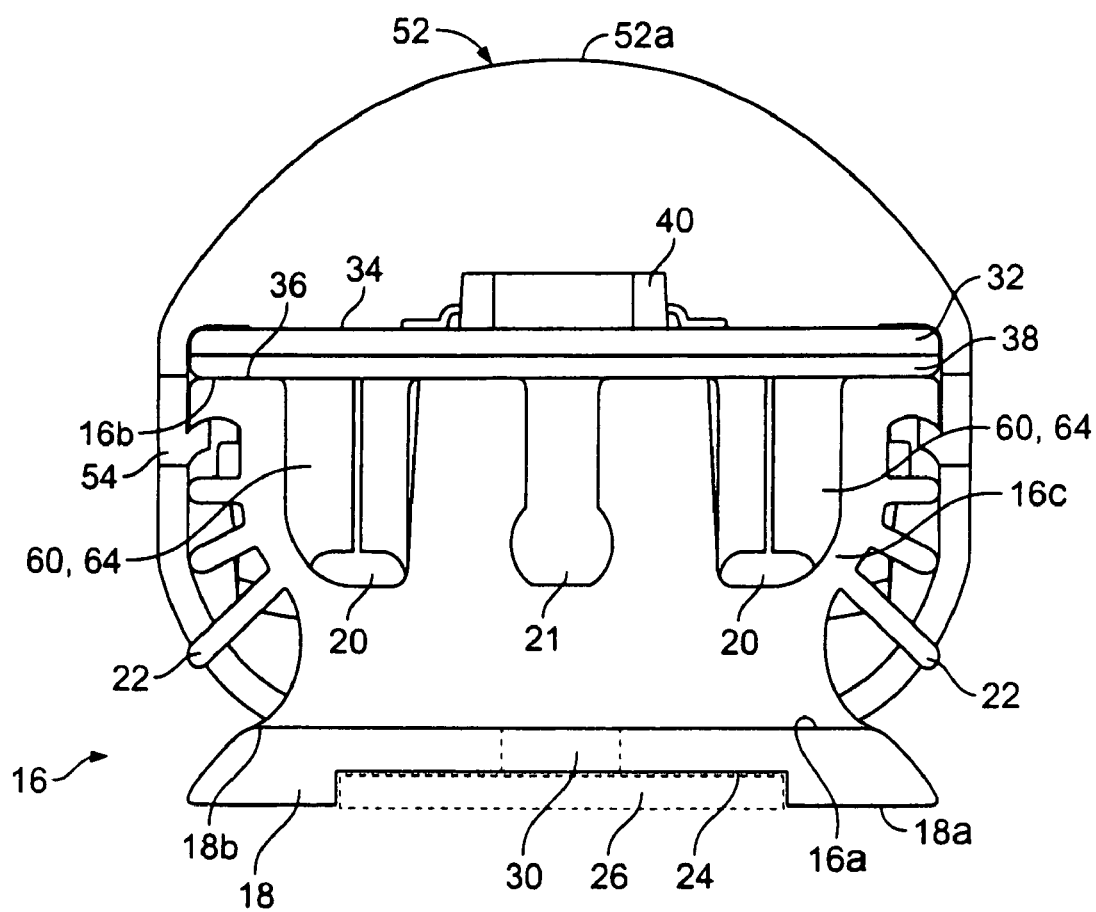
FIG. 5 is a sectional view of the module, including the cover, constructed in accordance with the principles of the present invention.

FIG. 5 is the end or sectional view the entire light emitting diode illumination module, pod, or unit 12, constructed in accordance with the principles of the present invention and illustrating the primary embodiment of the invention. Additionally the double-sided adhesive foam tape 26 is depicted by a dashed rectangle in the depression area 24 of the heat sink mass 14.

The present invention allows significantly increased tolerances for electrical component configuration. The present invention has been configured to reduce operating temperature of the light emitting diodes 40 while maximizing the dissipation of ambient heat of the printed circuit board 32 created during its operation. This consideration further expands the range of applications this invention can be utilized in such as refrigeration environments where earlier forms of light emitting diode lighting systems maximized heat output, without consideration, to the detriment of the system component and/or the environment in which it is utilized.

As to the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

The invention claimed is:

1. An illumination system featuring modules of high-power, high-intensity light emitting diodes coupled in parallel configuration, the system comprising:
   a plurality of similarly configured modules each having a metallic mass with an elongated upper component and an elongated lower component, each upper component including a generally flat lower surface and upper surface with laterally spaced wiring channels and a central longitudinal void there between, each upper component also including a curved sides with outwardly extending fins for heat sink purposes, each lower component having a lower surface with a longitudinal depressed area with an adhesive tape there within and an upper surface adjoining the lower surface of the upper component, each lower component having a length greater than the length of its associated upper component to form a mounting tab with a mounting aperture there through;
   each module also having a circuit board with a front face and a back face mounted on the upper surface of the upper component, each circuit board being fabricated of an insulating bottom layer consisting of high grade steel, a second layer consisting of a dielectric coating, a third layer consisting of a copper trace pattern, a fourth layer consisting of a dielectric layer, and a top ceramic coated layer;
   a plurality of electrical components coupled to the trace pattern of each circuit board, the electrical components including a plurality of high-intensity light emitting diodes, a light emitting diode driver control chip, a single high-frequency capacitor filter, rectifying diodes that convert electrical potential from AC to DC, surface mounted resistors adapted to regulate the electrical potential and illuminate the light emitting diodes, wherein each circuit board has two pairs of small holes for the passage of insulation displacement connectors and one pair of large holes for screws to couple the circuit boards to the metallic mass extending there through;
   each module also having a translucent cap cover positionable over a central extent of an associated circuit board, the cap cover having a generally semi-cylindrical upper surface and lateral snap tabs adapted to couple the cover with its associated circuit board;
   a pair of continuous alternating current carrying insulated stranded copper core conductor wires coupling the plurality of modules in parallel, each wire extending through a wiring channel of the upper components of the module and aligned with a cross cut channel in the upper component for allowing the electrical components to couple with the wires; and
   pairs of electrically conductive insulation displacement connectors extending through each of the circuit boards, each connector having an upper end coupled to the trace pattern and a lower end extending into the wiring channel to frictionally affix, and electrically couple the connector to the wire.

2. An illumination system comprising:
   a first module and a second module, each module having:
     a metallic mass with laterally spaced wiring channels and outwardly extending fins;
     a circuit board mounted on the module and fabricated of an insulating bottom layer with trace patterns thereon; and,
     a plurality of electrical components coupled to the trace patterns of the circuit board and including at least one light emitting diode;
   a pair of conductor wires that electrically connect the first and second modules in parallel, wherein each conductor wire extends continuously and un-segmented through a wiring channel of each module; and
   wherein each module has one pair of connectors extending through the circuit board with upper ends coupled to the trace patterns and lower ends extending downwardly to electrically couple with the wires.

3. The system as set forth in claim 2 and further including two high-power, high-intensity light emitting diodes, a light emitting diode driver control chip, a single high-frequency capacitor filter, rectifying diodes that convert electrical potential from AC to DC, and a plurality of surface mounted resistors adapted to regulate the electrical potential and illuminate the light emitting diodes.

4. The system as set forth in claim 2 and further including at least one light emitting diode and a light emitting diode driver control chip.

5. The system as set forth in claim 2 and further including at least one light emitting diode and a single high-frequency capacitor filter to abate undesired electrical noise.

6. The system as set forth in claim 2 and further including at least one light emitting diode and a rectifying diode that convert electrical potential from AC to DC and at least one surface mounted resistor.

7. A light emitting diode (LED) module comprising:
a heat sink mass;
a circuit board assembly comprising:
  a metal bottom layer positioned on an upper surface of the mass;
  a first dielectric coating layer positioned on the bottom layer;
  a copper trace pattern layer positioned on the first dielectric coating layer;
  a second dielectric coating layer positioned on the copper trace pattern layer;
  a ceramic coating layer positioned on the second dielectric coating layer; and,
an arrangement of electrical components mounted to the circuit board assembly and electrically connected to the copper trace pattern, the component arrangement including at least one light emitting diode, a resistor and a driver control chip that regulates voltage to the light emitting diode.

8. The light emitting diode module of claim 7, wherein the bottom layer is fabricated from a heat conductive metal selected from the group of steel, stainless steel and aluminum.

9. The light emitting diode module of claim 7, further comprising at least one connector having an upper portion extending into the circuit board to provide electrical connection with the copper trace pattern, the connector further having a bottom portion extending into the heat sink mass.

10. The light emitting diode module of claim 9, wherein the upper portion of the connector has an upper end that is positioned above the ceramic coating layer of the circuit board.

11. The light emitting diode module of claim 9, wherein the circuit board includes at least one hole configured to receive an elongated fastener that secures the circuit board to the mass.

12. The light emitting diode module of claim 9, further comprising a conductor wire that extends continuously through a longitudinal channel of the mass, wherein the bottom connector portion extends into the channel and electrically couples with the conductor wire.

13. The light emitting diode module of claim 7, wherein the component arrangement further including a high-frequency capacitor that filters undesired electrical noise and a rectifying diode that converts electrical potential from AC to DC.

14. A light emitting diode module comprising:
a heat sink mass;
a circuit board positioned on the mass;
an arrangement of components electrically connected to the circuit board, the component arrangement including at least one light emitting diode, a driver control chip configured to regulate the voltage to the light emitting diode, a resistor, and a rectifying diode that converts electrical potential from alternating current to direct current; and,
at least one connector having an upper portion extending into the circuit board to provide electrical connection with the component arrangement, the connector further having a bottom portion extending into the heat sink mass.

15. The light emitting diode module of claim 14, wherein the component arrangement further includes a high-frequency capacitor that filters undesired electrical noise resulting from the operation of the electrical components.

16. The light emitting diode module of claim 14, wherein the component arrangement includes a light emitting diode positioned at opposed ends of the circuit board, and wherein the driver control chip is positioned in a central portion of the circuit board between the light emitting diodes.

17. The light emitting diode module of claim 16, wherein the circuit board includes a hole dimensioned to receive an elongated fastener that secures the circuit board to the mass, wherein the hole is positioned between the driver control chip and one of the light emitting diodes.

18. The light emitting diode module of claim 14, wherein the components are positioned on a central portion of the circuit board, and wherein a cover is positioned over the driver control chip, the resistor and the rectifying diode, while the light emitting diode remains exposed.

19. The light emitting diode module of claim 18, wherein the cover includes at least one tab that releasably engages a rib of the heat sink mass.

20. The light emitting diode module of claim 14, wherein the mass has a longitudinal channel, wherein a conductor wire extends continuously through the longitudinal channel, and wherein the bottom connector portion extends into the channel and electrically connects with the conductor wire.

21. The light emitting diode module of claim 20, the mass further having a cross-cut channel intersecting the longitudinal channel to define a void area within the mass.

22. The light emitting diode module of claim 21, wherein the longitudinal channel extends between opposed end walls of the mass and the cross-cut channel extends between opposed side walls of the mass, and wherein the bottom connector portion extends into the void area for connection with the conductor wire.

23. The light emitting diode module of claim 20, wherein the bottom connector portion electrically connects with the conductor wire to define a single-point connection with the conductor wire.

24. A lighting system comprising:
a first module and a second module, wherein each module has a heat sink mass with a first and a second internal longitudinal channel, each module further having a circuit board positioned on the mass, the circuit board having at least one light emitting diode, a driver control chip and a resistor, each module further having both a first connector that extends downward through the circuit board and into the first longitudinal channel and a second connector that extends downward through the circuit board and into the second longitudinal channel;
a first conductor wire extending continuously through the first longitudinal channel of both the first module and the second module, wherein the first conductor wire is electrically coupled to the first connector of each module;
a second conductor wire extending continuously through the second longitudinal channel of both the first module and the second module, wherein the second conductor wire is electrically coupled to the second connector of the each module;
wherein the first and second conductor wires connect the first and second modules in parallel.

25. The lighting system of claim 24, wherein the each circuit board of the first and second modules further includes both a high-frequency capacitor that filters undesired electrical noise and a rectifying diode that converts electrical potential from alternating current to direct current.

26. The lighting system of claim 24, wherein the first and second modules each include a cover positioned over the resistor and the first and second connectors, while the light emitting diode remains exposed.

27. The lighting system of claim 24, wherein the heat sink mass of each module includes a lower portion and an upper portion, and wherein the length of the lower portion exceeds the length of the upper portion to define a mounting tab for the module.

28. A lighting system for use within a display sign, the lighting system comprising:
- a first module having an elongated, metal-core circuit board and an arrangement of components electrically connected to the circuit board, the component arrangement including:
    - a pair of light emitting diodes wherein each diode is mounted to a longitudinal end portion of the circuit board;
    - a driver control chip that provides regulated voltage to the light emitting diodes, the control chip positioned at a central portion of the circuit board between the light emitting diodes;
    - a high-frequency capacitor that filters undesired electrical noise resulting from operation of the components; and,
    - at least one surface mounted resistor.

29. The lighting system of claim 28, wherein the component arrangement further includes a rectifying diode that converts electrical potential from alternating current to direct current.

30. The lighting system of claim 28, wherein the circuit board includes a first hole dimensioned to receive a first elongated fastener for securement of the circuit board to a mounting surface of the display sign, wherein the first hole is positioned between the driver control chip and one of the light emitting diodes.

31. The lighting system of claim 30, wherein the circuit board includes a second hole dimensioned to receive a second elongated fastener, wherein the second hole is positioned between the driver control chip and the other of the light emitting diodes.

32. The lighting system of claim 28, further comprising a second module electrically connected to the first module by a pair of conductor wires, the second module having an elongated, metal-core circuit board and an arrangement of components electrically connected to the circuit board, the component arrangement including a pair of light emitting diodes wherein each diode is mounted to a longitudinal end portion of the circuit board.

33. The lighting system of claim 32, wherein the component arrangement of the second module further includes a high-frequency capacitor that filters undesired electrical noise and at least one surface mounted resistor.

* * * * *